United States Patent [19]
Arendt et al.

[11] Patent Number: 5,872,080
[45] Date of Patent: Feb. 16, 1999

[54] HIGH TEMPERATURE SUPERCONDUCTING THICK FILMS

[75] Inventors: Paul N. Arendt; Xin Di Wu; Steve R. Foltyn, all of Los Alamos, N. Mex.

[73] Assignee: The Regents of the University of California, Los Alamos, N. Mex.

[21] Appl. No.: 425,752

[22] Filed: Apr. 19, 1995

[51] Int. Cl.$^6$ .................................................... H01L 39/00
[52] U.S. Cl. ..................... 505/238; 505/237; 505/239; 505/701; 505/704; 428/469; 428/472.2; 428/701; 428/702; 428/930
[58] Field of Search ..................... 505/237, 238, 505/239, 701–704; 428/688, 930, 689, 701, 702, 457, 469, 472.2

[56] References Cited

U.S. PATENT DOCUMENTS

| | | | |
|---|---|---|---|
| 5,019,554 | 5/1991 | Takeshi et al. | 505/702 |
| 5,057,484 | 10/1991 | Shiota et al. | 505/701 |
| 5,102,865 | 4/1992 | Woolf et al. | 505/701 |
| 5,252,551 | 10/1993 | Wu et al. | 428/688 |
| 5,420,102 | 5/1995 | Harshavardhan et al. | 505/237 |
| 5,650,378 | 7/1997 | Iijima et al. | 505/473 |

OTHER PUBLICATIONS

G. N. Van Wyk et al., "Crystalline Reorientation due to Ion Bombardment" Nucl. Instr. Meth. 170, pp. 433–439 (1980).

D. Dobrev "Ion–Beam–Induced Texture Formation in Vacuum–Condensed Thin Metal Films," Thin Solid Films 92, pp. 41–53 (1982).

R. Mark Bradley et al., "Theory of Thin–Film Orientation by Ion Bombardment During Deposition," J. Appl. Phys. 60, pp. 4160–4164 (Dec. 15, 1986).

Lock See Yu et al., "Control of Thin film Orientation by Glancing Angle Ion Bombardment During Growth," J. Vac. Sci. Technol. A4, pp. 443–447 (May/Jun. 1986).

N. Sonnenberg et al., "Preparation of Biaxially Aligned Cubic Zirconia Films on Pyrex Glass Substrates Using ion–Beam Assisted Deposition," J. Appl. Phys. 74, pp. 1027–1034 (Jul. 15, 1993).

Taichi Yamaguchi et al., "Superconducting Properties of YBCO Thin Films Prepared by Chemical Vapor Deposition on $SrTiO_3$ and A Metal Substrate," Appl. Phys. Lett. 55, pp. 1581–1582 (Oct. 9, 1989).

E. Narumi et al., "Superconducting YBCO Films on Metallic Substrates Using In Situ Laser Deposition," Appl. Phys. 56, pp. 2684–2686 (Jun. 25, 1990).

David P. Norton et al., "YBCO Thin Films Grown on Rigid and Flexible Polycrystalline Yttria–Stabilized Zirconia by Pulsed Laser Ablation," J. Appl. Phys. 68, pp. 223–227 (Jun. 1, 1990).

Junichi Saitoh et al., "Deposition of YBCO Thin Films on Metallic Substrates by Laser Ablation," Jpn. J. Appl. Phys. 29, pp. L1117–L1119 (Jun. 1990).

Junichi Saitoh et al., "Preparation of YBCO Superconducting Thin Films on Metallic Substrates by Excimer Laser Ablation," Jpn. J. Appl. Phys. 30, pp. L898–L900 (May 1991).

(List continued on next page.)

*Primary Examiner*—Marie Yamnitzky
*Attorney, Agent, or Firm*—Bruce H. Cottrell

[57] ABSTRACT

A superconducting article including a flexible polycrystalline metal substrate, a layer of an adhesion layer material upon the surface of the flexible polycrystalline metal substrate, a layer of a cubic oxide material upon the adhesion layer material, the first layer of cubic oxide material deposited by ion beam assisted deposition, a layer of a buffer material upon the ion beam assisted deposited cubic oxide material layer, and, a layer of YBCO upon the buffer material layer is provided and has demonstrated $J_c$'s of $1.3 \times 10^6$ A/cm$^2$, and $I_c$'s of 120 Amperes across a sample 1 cm wide.

25 Claims, 1 Drawing Sheet

OTHER PUBLICATIONS

K. S. Harshavardhan et al., "YBCO Films on Flexible, Partially Stabilized Zirconia Substrates with Fully Stabilize Zirconia Buffer Layers," Appl. Phys. Lett. 59, pp. 1638–1640 (Sep. 23, 1991).

J. D. Budai et al., "In–Plane Epitaxial Alignment of YBCO Films Grown on Silver Crystals and Buffer Layers," Appl. Phys. Lett. 62, pp. 1836–1838 (Apr. 12, 1993).

R. Chatterjee et al., "Transport Properties and Surface Morphology in Y123 Films on Metallic Substrates with Grain–Oriented Buffer Layer," Physica C 224, pp. 286–292 (1994).

Y. Iijima et al., "In–Plane Aligned YBCO Thin Films Deposited on Polycrystalline Metallic Substrates," Appl. Phys. Lett. 60, pp. 769–771 (Feb. 10, 1992).

R. P. Reade et al., "Laser Deposition of Biaxially Textured Yttria–Stabilized Zirconia Buffer Layers on Polycrystalline Mettalic Alloys for High Critical Current YBCO Thin Films," Appl. Phys. Lett. 61, pp. 2231–2233 (Nov. 2, 1992).

Y. Iijima et al., "Structural and Transport Properties of Biaxially aligned YBCO Films on Polycrystalline Ni–Based Alloy with Ion–Beam–Modified Buffer Layers," J. Appl. Phys. 74, pp. 1905–1911 (Aug. 1, 1993).

Yasuhiro Iijima et al. "High–Current Laser–Ablated YBCO Tape with Biaxially Aligned Structure," Proc. of the $7^{th}$ Inter. Symposium on Superconductivity (ISS'94), Nov. 8–11, 1994, Kitakyushu, Japan.

Y. Iijima et al., "In–Plane Texturing Control of YBCO Thin Films on Polycrystalline Substrates by Ion–Beam–Modified Intermediate Buffer Layers," IEEE Trans. On Appl. Superconductivity, vol. 3, No. 1, Mar. 1993.

K. Fujino et al., "One Meter Long Thin Film Tape With Jc More than $10^5$ $A/cm^2$ Fabricated by Pulsed Laser Deposition," Proc. of the $7^{th}$ Inter. Symposium on Superconductivity (ISS'94), Nov. 8–11, 1994, Kitakyushu, Japan.

J. Fukutomi et al., "Laser Deposition of YBCO Thin Films on A Metallic Substrate with Biaxially Textured YSZ Buffer Layers Prepared by Modified Bias Sputtering," Physica C 219, pp. 333–339 (1994).

M. Fukutomi et al., "Deposition of In–Plane Aligned YBCO/$Y_2O_3$ Stabilized $ZrO_2$ Thin Films on Both Sides of Metallic Tape Substrates," Physica C 231, pp. 113–117 (1994).

S. Aoki et al., "Preparation of In–Plane Textured $Y_2O_3$ Doped $ZrO_2$ Thin Film on Polycrystalline Metallic Tape by Modified Bias Sputtering," J. Vac. Sci. Technol. A12, pp. 501–505 (Mar./Apr. 1994).

M. Fukutomi et al., "Control of $Y_2O_3$ Stabilized $ZrO_2$ Thin Film Orientation by Modified Bias Sputtering," Thin Solid Films 239, pp. 123–126 (1994).

P. Arendt et al., "Fabrication of Biaxially Oriented YBCO on (ool) Biaxially Oriented Yttria–Stabilized–Zirconia on Polycrystalline Substrates", Mat. Res. Soc. Symp. Proc., vol. 341, pp. 209–214, 1994.

X. D. Wu et al., "High Current $YBa_2 Cu_3 O_{7-g}$ thick films on flexible nickel substrates with textured buffer layers", Appl. Phys. Lett. 65(15), pp. 1961–1963, Oct. 10, 1994.

X. D. Wu et al., "Properties of $YBa_2 Cu_3 O_{7-g}$ thick films on flexible buffered metallic substrates", Appl. Phys. Lett. 67(16), pp. 2397–2399, Oct. 16, 1995.

| | 10 |
|---|---|
| | 12 |
| | 14 |
| | 16 |
| | 18 |
| | 20 |

HIGH TEMPERATURE SUPERCONDUCTING THICK FILMS

FIELD OF THE INVENTION

The present invention relates to processes of preparing high temperature superconducting thick films on polycrystalline substrates and to resultant superconducting articles from the various processes whereby improved $J_c$'s can be achieved. This invention is the result of a contract with the United States Department of Energy (Contract No. W-7405-ENG-36).

BACKGROUND OF THE INVENTION

The major effort to produce high Tc superconducting wires and tapes has been focused on the oxide powder in tube (OPIT) process. Furthermore, bismuth- and thallium-based superconductors have been the material of choice since platelike morphology can be obtained in both of these type superconductors after the OPIT process, thus reducing the known weak-link problem. Although tremendous progress has been made in recent years in producing long high $T_c$ wires and tapes by using OPIT, only limited success has been achieved in producing a uniform microstructure of the right superconducting phase over long lengths.

Very little effort has been focused on production of $YBa_2Cu_3O_{7-\delta}$ (YBCO) wires and tapes due to serious weak-link problems in the YBCO superconductor. Melt-textured processing has yielded excellent YBCO superconductors, but it is considered a difficult process to scale up for long lengths. A possible process has been referred to as the thick film process. In the thick film process, it has been shown that YBCO thin films on single crystal substrates have critical current density ($J_c$) values of over $10^6$ amperes per square centimeter (A/cm$^2$) at 77K. There have been a number of reports on depositing buffer layers on metal substrates which can be easily obtained in long lengths as compared to flexible polycrystalline yttria-stabilized zirconia (YSZ) substrates.

One process of depositing a YSZ layer has been by use of ion beam assisted deposition (IBAD) in which a YSZ layer is deposited in combination with irradiation from an ion beam directly on a substrate during the deposition. For example, both Iijima et al., Appl. Phys. Lett., vol. 74, no. 3, pp. 1905 (1993) and Reade et al., Appl. Phys. Lett., vol. 61, no. 18, pp. 2231–2233 (1992) have demonstrated deposition of highly in-plane textured YSZ buffer layers with IBAD, leading to YBCO thin films having excellent superconducting properties. Another development has been the addition of a layer between the substrate surface and the YSZ layer. For example, Chatterjee et al., Physica C, v. 224, pp. 286–292 (1994) describe the use of metallic underlayers of platinum, palladium, gold or silver as a barrier layer between a metallic substrate and the YSZ layer.

Despite the results from previous work on developing YBCO superconducting films on flexible polycrystalline metal substrates, further improvements in the resultant properties have been desired. After extensive and careful investigation, improvements have been found to the preparation of YBCO superconducting films on polycrystalline substrates such as flexible polycrystalline metal substrates, each improvement contributing in portion to the resultant desired properties.

It is an object of the present invention to provide YBCO superconducting films on polycrystalline substrates demonstrating improved properties.

SUMMARY OF THE INVENTION

To achieve the foregoing and other objects, and in accordance with the purposes of the present invention, as embodied and broadly described herein, the present invention provides a superconducting article including a flexible polycrystalline metal substrate, a layer of an adhesion layer material upon the surface of the flexible polycrystalline metal substrate, a layer of a cubic oxide material upon the adhesion layer material, the first layer of cubic oxide material deposited by ion beam assisted deposition, a layer of a buffer material upon the ion beam assisted deposited cubic oxide material layer, and, a layer of YBCO upon the buffer material layer.

One embodiment of the invention involves an improvement in the process of depositing a textured metal oxide thin film upon a polycrystalline metal substrate using ion beam assisted deposition, wherein the improvement is using at least a portion of light ions in said ion beam assisted deposition.

Another embodiment of the invention involves an improvement in the process of forming a superconducting article including a flexible polycrystalline metal substrate, a layer of an oriented cubic oxide material upon the metal substrate, and a layer of YBCO upon the cubic oxide material layer, wherein the improvement is placing an adhesion-promoting layer of a material selected from the group consisting of aluminum oxide, cerium oxide, magnesium oxide, polycrystalline yttria-stabilized zirconium oxide and yttrium oxide between the metal substrate and the layer of oriented cubic oxide material.

Still another embodiment of the invention involves an improvement in the process of forming a superconducting article including a flexible polycrystalline metal substrate, a layer of a oriented cubic oxide material upon the metal substrate, and a layer of YBCO upon the cubic oxide material layer, the improvement comprising using as the flexible polycrystalline metal substrate a metal substrate containing at least about 3 atomic percent aluminum.

BRIEF DESCRIPTION OF THE DRAWINGS

FIG. 1 shows an illustrative structure of a superconductive article in accordance with the present invention.

DETAILED DESCRIPTION

The present invention is concerned with high temperature superconducting wire or tape and the use of high temperature superconducting thick films to form such wire or tape. In the present invention, the superconducting material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. Other superconducting materials such as bismuth and thallium based superconductor materials may also be employed. $YBa_2Cu_3O_{7-\delta}$ is preferred as the superconducting material.

In the high temperature superconducting thick film of the present invention, the substrate can be, e.g., any polycrystalline material such as a metal or a ceramic such as polycrystalline aluminum oxide or polycrystalline zirconium oxide. Preferably, the substrate can be a polycrystalline metal such as nickel. Alloys including nickel such as various Hastalloy metals are also useful as the substrate. The metal substrate on which the superconducting material is eventually deposited should preferably allow for the resultant article to be flexible whereby superconducting articles (e.g., coils, motors or magnets) can be shaped.

It has been previously known that ion beam assisted deposition of an intermediate material such as YSZ between a metal substrate and YBCO gives improved results. A dual-ion-beam sputtering system similar to that described by Iijima et al., IEEE Trans. Appl. Super., vol. 3, no.1, pp.1510 (1993), can be used to deposit such a YSZ film. Generally, the substrate normal to ion-assist beam angle is 54.7°±3°. The YSZ layer in the ion beam assisted deposition is typically sputtered from a polycrystalline ceramic zirconia target containing about 10 atomic percent yttria.

In one aspect of the present invention, the ion source gas in the ion beam assisted deposition includes at least some light ions such as neon or helium. More preferably, the ion source gas generally includes up to about 90 percent by volume of the light ions such as neon or helium with the remainder being xenon, krypton, or argon, preferably argon, to facilitate maintaining the plasma. Higher amounts of the light ions may be used so long as the plasma can be maintained. Use of about 90 percent by volume of the light ions has been found to contribute to a more textured YSZ layer yielding an improvement in results of about two times. The ion beam assisted deposition of YSZ is conducted with substrate temperatures of generally from about 20° C. to about 250° C. The YSZ layer deposited by the IBAD process is generally from about 100 Å to about 10,000 Å in thickness, preferably about 5000 Å to about 7000 Å.

While the YSZ intermediate layer has been known for the purpose of allowing deposition of YBCO on metal substrates, it has been found that the metal substrate often does not bond well to the YSZ layer. Another aspect of the present invention is the use of an intermediate layer between the metal substrate and the YSZ deposited by the IBAD process. This intermediate layer serves as an adhesion layer between the metal substrate and the YSZ layer. While not wishing to be bound by the present explanation, it is believed that such an adhesion layer provides a better ceramic to metal interface and may further reduce any oxidation of the metal substrate. This intermediate layer can generally be a material such as aluminum oxide ($Al_2O_3$), cerium oxide ($CeO_2$), yttrium oxide ($Y_2O_3$), magnesium oxide (MgO) or polycrystalline YSZ. The preferred material is aluminum oxide. The intermediate layer is deposited by sputter deposition or laser deposition at temperatures of generally greater than about 400° C. Use of such high temperatures helps in providing the good ceramic to metal interface not achieved when YSZ is deposited in the IBAD process, which is a lower temperature process. The intermediate adhesion layer is generally from about 300 Å to about 1000 Å or more in thickness, preferably greater than about 1000 Å.

In another aspect of the present invention, it has been found preferable to use aluminum-containing metals as the metal substrate, such aluminum-containing metals including at least about 3 atomic percent aluminum. Metal substrates containing aluminum have been found to achieve superior results in the final superconducting article. Preferably, the aluminum-containing metal substrate contains at least about 30 atomic percent aluminum. Among the suitable aluminum-containing alloys are included an alloy of about 50 atomic percent aluminum and about 50 atomic percent nickel and an alloy of about 30 atomic percent aluminum and about 70 atomic percent nickel. Alloys of iron/aluminum such as 40 atomic percent aluminum/60 atomic percent iron or of silver/aluminum such as 15 atomic percent aluminum/85 atomic percent silver can also be used. Other additives may be added to the aluminum-containing metal substrates as desired to improve other known properties of the metal.

An additional aspect of using the aluminum-containing metal substrates is that an intermediate layer of aluminum oxide between the metal substrate and the YSZ deposited by the IBAD process can be directly formed in situ. Using aluminum-containing metal substrates with less than about 30 atomic percent aluminum has generally required a heat treatment of the metal substrate to form the aluminum oxide layer, while with aluminum-containing metal substrates containing greater than about 30 atomic percent aluminum, an intermediate aluminum oxide layer is achieved without any required heat treatment other than that achieved during normal deposition processing. Heat treatment of the aluminum-containing metal substrate generally involves heating at from about 800° C. to about 1000° C. in a reducing atmosphere of, e.g., hydrogen or ammonia, in the presence of a trace of water or oxygen (about 1 percent).

The YBCO layer can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, and liquid phase epitaxy.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The target substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

Still another aspect of the present invention is the use of an intermediate layer between the YSZ layer deposited by the IBAD process and the superconducting YBCO layer. This intermediate layer serves as a buffer layer between the YSZ layer and the YBCO and assists in lattice matching. This so-called "buffer layer" should have good "structural compatibility" between the YSZ or other cubic oxide material deposited in the IBAD process and the YBCO and should have good chemical compatibility with both adjacent layers. By "chemical compatibility" is meant that the intermediate layer does not undergo property-degrading degrading chemical interactions with the adjacent layers. By "structural compatibility" is meant that the intermediate layer has a substantially similar lattice structure with the superconductive material. Among the materials suitable as this intermediate buffer layer are cerium oxide, yttrium oxide and other cubic oxide materials such as those described in U.S. Pat. No. 5,262,394, by Wu et al. for "Superconductive Articles Including Cerium Oxide Layer" such description hereby incorporated by reference.

Still another aspect of the present invention is the deposition of the intermediate or buffer layer at temperatures of greater than about 800° C., preferably at temperatures of from about 800° C. to about 950° C. Raising the deposition temperature of this layer has been found to promote the greatest reduction in degrees of full-width-half maxima (FWHM) in the x-ray phi scan of the YBCO as compared to the x-ray phi scan of the IBAD-YSZ. For example, at temperatures under about 800° C. the delta phi (reduction in peak width) of YBCO(103) (in degrees FWHM) is up to about only 6°, while at temperatures of greater than about 800° C. the delta phi (reduction in peak width) increases to from about 7.5° to about 11°.

Figure 1:
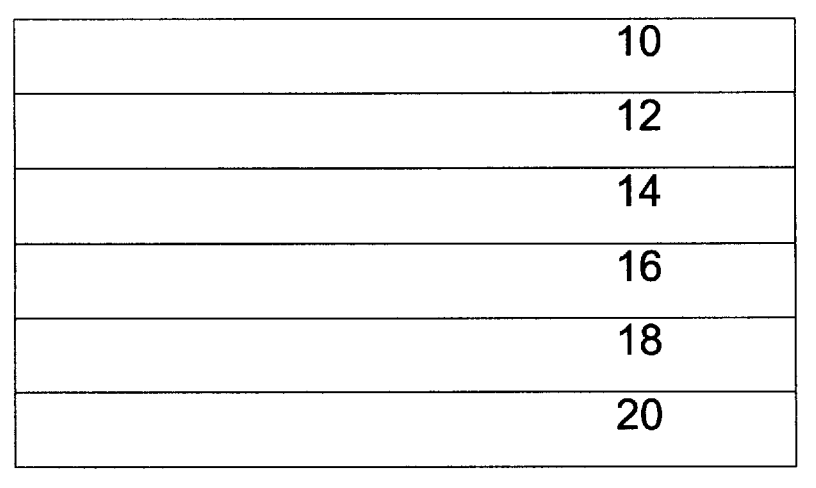

In a preferred embodiment of the present invention illustrated in FIG. 1, a 50/50 atomic percent aluminum/nickel substrate 10 is initially coated with a layer of aluminum oxide 12 from about 800 Å to 1000 Å in thickness deposited by pulsed laser deposition. Then, a layer 14 of YSZ (about 6000 Å) is deposited on the aluminum oxide by ion beam assisted deposition using neon to supply the light ions as the ion assist beam to help the crystallinity or texturing. Then, a further layer 16 of YSZ is deposited upon the IBAD-YSZ layer, the further layer of YSZ deposited in a hot process such as pulsed laser deposition. Next an intermediate or buffer layer 18 of yttrium oxide of from about 200 Å to about 2000 Å in thickness is deposited on the YSZ layer. Finally, a layer 20 of YBCO is deposited, e.g., by pulsed laser deposition at a thickness of, e.g., about 10,000 Å to 20,000 Å.

The present invention is more particularly described in the following examples which are intended as illustrative only, since numerous modifications and variations will be apparent to those skilled in the art.

EXAMPLE 1

A dual-ion-beam sputtering system similar to that of Iijama et al. was used to deposit a YSZ film upon a flexible metal substrate of Hastalloy C-276 or other nickel-based alloys. The substrates were ultrasonically cleaned in soap and water, rinsed with deionized water, rinsed with methanol and blown dry with filtered argon. Where necessary to remove scratches, the metal substrates were electropolished. Ion sources manufactured by Ion Tech, Inc. (Ft. Collins, Colo.) with a sputter diameter of 5 cm and an assist source diameter of 2.5 cm were used. The substrate normal to ion-assist beam angle was 54.7°±3°. The YSZ layer in this ion beam assisted deposition was sputtered from a polycrystalline ceramic zirconia target containing about 10 atomic percent yttria. The ion source gas included about 90 percent neon with the remainder argon. For comparison, the ion source gas included 100 percent argon. The ion source gas was introduced to a background partial pressure of from about $1.5–2.5\times10^{-6}$ Torr with a total pressure during deposition of about $1\times10^{-4}$ Torr. The ion-sputter gun voltage and current were about 800 eV and 100 mA respectively. The ion-assist gun voltage and current density were about 250 eV and 150 $\mu A/cm^2$ respectively.

The results of the x-ray phi scan measurements on the YSZ layers deposited with the pure argon ion source gas and on the YSZ layers deposited with the 90 percent neon and 10 percent argon showed full-width-half maxima of 22° and 12° for YSZ(202) peaks respectively, approximately an 85 percent improvement for the deposition using the addition of the neon. Similar results were obtained with helium. Thus, use of the light ions in the ion beam assisted deposition provided improved crystallinity or texturing.

EXAMPLE 2

Deposition of the intermediate or buffer layers at temperatures of greater than about 800° C., preferably at temperatures of from about 800° C. to about 950° C. was studied. Raising the deposition temperature of this layer has been found to promote the greatest YBCO texturing. At temperatures under about 800° C. the delta phi (in degrees FWHM) is up to about only 6°, while at temperature of greater than about 800° C. the delta phi increases to from about 7.5° to about 11°. Such an increase dramatically demonstrates the benefit of depositing this intermediate layer at higher temperatures.

EXAMPLE 3

On a metal substrate, 50 atomic percent aluminum and 50 atomic percent nickel, was deposited by pulsed laser deposition a layer of aluminum oxide about 800 to 1000 angstroms in thickness. Onto this resultant article was deposited a layer of YSZ about 6000 angstroms in thickness using ion beam assisted deposition with an ion assist gas source of 90 percent by volume neon, remainder argon. Onto the YSZ layer was then deposited a layer of yttrium oxide about 300 angstroms in thickness by pulsed laser deposition. Finally, a layer of YBCO about 12,000 angstroms in thickness was then deposited on the yttrium oxide by pulsed laser deposition. A phi scan of the (111)YSZ peak showed a FWHM of 14.4°. A phi scan of the (103)YBCO peak showed a FWHM of 6.6°. The superconducting YBCO material was 330 microns wide, 4 millimeters long and 1.2 microns thick. The $J_c$ was measured as $1.3\times10^6$ $A/cm^2$.

EXAMPLE 4

On a nickel alloy substrate, (Haynes 242), was deposited by pulsed laser deposition a layer of aluminum oxide about 800 to 1000 angstroms in thickness. Onto this resultant article was deposited a layer of YSZ about 6000 angstroms in thickness using ion beam assisted deposition with an ion assist gas source of 90 percent by volume neon, remainder argon. Onto the YSZ layer was then deposited a layer of yttrium oxide about 300 angstroms in thickness by pulsed laser deposition. Finally, a layer of YBCO about 20,000 angstroms in thickness was then deposited on the yttrium oxide by pulsed laser deposition. The $J_c$ was measured as $0.6\times10^6$ $A/cm^2$. The $I_c$ was measured as 120 Amperes across a sample 1 cm wide.

Although the present invention has been described with reference to specific details, it is not intended that such details should be regarded as limitations upon the scope of the invention, except as and to the extent that they are included in the accompanying claims.

What is claimed is:

1. A superconducting article comprising:
   a flexible polycrystalline metal substrate;

a layer of an adhesion layer material upon the substrate;

a layer of a cubic oxide material upon the adhesion layer material, the layer of cubic oxide material deposited by ion beam assisted deposition using a percentage of light ions in said ion beam assisted deposition whereby said layer of cubic oxide material is characterized as having a full-width-half maxima in an x-ray phi scan of less than a layer of said cubic oxide material deposited by ion beam assisted deposition in the absence of light ions, said light ions selected from the group consisting of helium and neon;

a layer of buffer material upon the ion beam assisted deposited cubic oxide material layer; and, a layer of YBCO upon the buffer material layer.

2. The article of claim 1 wherein the metal substrate contains at least about 3 atomic percent aluminum.

3. The article of claim 2 wherein the adhesion layer material is aluminum oxide and the adhesion layer is formed by suitable heat treatment of the metal substrate.

4. The article of claim 1 wherein the metal substrate contains at least about 30 atomic percent aluminum.

5. The article of claim 1 wherein the metal substrate contains about 50 atomic percent aluminum and about 50 atomic percent nickel.

6. The article of claim 1 wherein the adhesion layer material is a material selected from the group consisting of aluminum oxide, cerium oxide, yttrium oxide, magnesium oxide and polycrystalline yttria-stabilized zirconia.

7. The article of claim 1 wherein the layer of buffer material is deposited at temperatures of from about 800° C. to about 900° C.

8. The article of claim 1 further including a second layer of a cubic oxide material situated between the layer of cubic oxide material upon the adhesion layer and the layer of buffer material, the second layer of a cubic oxide material deposited at temperatures of from about 700° C. and about 900° C.

9. The superconducting article of claim 1 wherein said cubic oxide material is yttria-stabilized zirconia.

10. The superconducting article of claim 9 wherein said buffer material is cerium oxide.

11. The superconducting article of claim 10 wherein said adhesion layer material is aluminum oxide.

12. The superconducting article of claim 1 wherein said buffer material is cerium oxide.

13. The superconducting article of claim 1 wherein said adhesion layer material is aluminum oxide.

14. A superconducting article comprising:

a flexible polycrystalline metal substrate;

a layer of a cubic oxide material upon the flexible polycrystalline metal substrate, the layer of cubic oxide material deposited by ion beam assisted deposition using a percentage of light ions in said ion beam assisted deposition whereby said layer of cubic oxide material is characterized as having a full-width-half maxima in an x-ray phi scan of less than a layer of said cubic oxide material deposited by ion beam assisted deposition in the absence of light ions, said light ions selected from the group consisting of helium and neon; and, a layer of YBCO upon the buffer material layer.

15. The superconducting article of claim 14 wherein said cubic oxide material is yttria-stabilized zirconia.

16. A superconducting article comprising:

a flexible polycrystalline metal substrate;

a layer of an adhesion layer material upon the flexible polycrystalline metal substrate;

a layer of a cubic oxide material upon the adhesion layer material, the layer of cubic oxide material deposited by ion beam assisted deposition using a percentage of light ions in said ion beam assisted deposition whereby said layer of cubic oxide material is characterized as having a full-width-half maxima in an x-ray phi scan of less than a layer of said cubic oxide material deposited by ion beam assisted deposition in the absence of light ions, said light ions selected from the group consisting of helium and neon; and, a layer of YBCO upon the buffer material layer.

17. The article of claim 16 wherein the adhesion layer material is a material selected from the group consisting of aluminum oxide, cerium oxide, yttrium oxide, magnesium oxide and polycrystalline yttria-stabilized zirconia.

18. The superconducting article of claim 16 wherein said cubic oxide material is yttria-stabilized zirconia.

19. The superconducting article of claim 18 wherein said adhesion layer material is aluminum oxide.

20. The superconducting article of claim 16 wherein said adhesion layer material is aluminum oxide.

21. A superconducting article comprising:

a flexible polycrystalline metal substrate;

a layer of a cubic oxide material upon the flexible polycrystalline metal substrate, the layer of cubic oxide material deposited by ion beam assisted deposition using a percentage of light ions in said ion beam assisted deposition whereby said layer of cubic oxide material is characterized as having a full-width-half maxima in an x-ray phi scan of less than a layer of said cubic oxide material deposited by ion beam assisted deposition in the absence of light ions, said light ions selected from the group consisting of helium and neon;

a layer of buffer material upon the ion beam assisted deposited cubic oxide material layer; and, a layer of YBCO upon the buffer material layer.

22. The article of claim 21 wherein the layer of buffer material is deposited at temperatures of from about 800° C. to about 900° C.

23. The superconducting article of claim 21 wherein said cubic oxide material is yttria-stabilized zirconia.

24. The superconducting article of claim 23 wherein said buffer material is cerium oxide.

25. The superconducting article of claim 21 wherein said buffer material is cerium oxide.

* * * * *